(12) United States Patent
Lei et al.

(10) Patent No.: US 10,594,332 B2
(45) Date of Patent: Mar. 17, 2020

(54) FRONT-END RECEIVING CIRCUIT AND METHOD FOR THE SAME

(71) Applicant: REALTEK SEMICONDUCTOR CORP., Hsinchu (TW)

(72) Inventors: Liang-Huan Lei, Kaohsiung (TW); Jian-Ru Lin, Nantou County (TW); Shih-Hsiung Huang, Miaoli County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/397,400

(22) Filed: Apr. 29, 2019

(65) Prior Publication Data

US 2020/0014394 A1  Jan. 9, 2020

(30) Foreign Application Priority Data

Jul. 9, 2018 (TW) .............................. 107123685 A (51) Int. Cl.
*H03M 1/34* (2006.01)
*H03M 1/12* (2006.01)

(52) U.S. Cl.
CPC ............ *H03M 1/34* (2013.01); *H03M 1/1245* (2013.01)

(58) Field of Classification Search
CPC ........ H03M 1/34; H03M 1/1245; H03M 1/12; H03M 1/00
USPC .................................................. 341/158, 155
See application file for complete search history.

(56) References Cited

U.S. PATENT DOCUMENTS

| 7,015,841 | B2* | 3/2006 | Yoshida | H03M 1/1245 |
| | | | | 341/120 |
| 7,479,834 | B2* | 1/2009 | Koukab | H03L 7/099 |
| | | | | 327/157 |
| 8,952,839 | B2* | 2/2015 | Wang | H03M 1/38 |
| | | | | 341/155 |
| 10,078,134 | B2* | 9/2018 | Patukuri | G01S 17/89 |
| 2007/0040617 | A1* | 2/2007 | Koukab | H03L 7/099 |
| | | | | 331/16 |
| 2008/0284398 | A1* | 11/2008 | Qiu | H02M 3/156 |
| | | | | 323/283 |

(Continued)

FOREIGN PATENT DOCUMENTS

| CN | 106470036 A | 3/2017 |
| TW | I335729 | 1/2011 |

*Primary Examiner* — Jean B Jeanglaude
(74) *Attorney, Agent, or Firm* — Li & Cai Intellectual Property (USA) Office (57) ABSTRACT

A front-end receiving circuit includes a first input terminal receiving a first signal, a second input terminal receiving a second signal, a comparator, a first sampling switch, a first sampling shifting circuit and a control circuit. The first sampling switch is coupled between the first input terminal and the first comparator input terminal. The first sample shifting circuit includes a first capacitor, a first reference voltage source, and a second reference voltage source. In a sampling mode, the control circuit is configured to control the first sampling switch and the second sampling switch to be turned on, and control the first shifting switch to be turned off. In a shifting mode, the control circuit is configured to control the first sampling switch and the second sampling to be turned off, and control the first shifting switch to be turned on.

20 Claims, 7 Drawing Sheets

(56) References Cited

U.S. PATENT DOCUMENTS

2012/0105265 A1\* 5/2012 Agarwal ............... H03M 1/002
  341/172
2014/0285370 A1 9/2014 Mike et al.

\* cited by examiner

FRONT-END RECEIVING CIRCUIT AND METHOD FOR THE SAME

CROSS-REFERENCE TO RELATED PATENT APPLICATION

This application claims the benefit of priority to Taiwan Patent Application No. 107123685, filed on Jul. 9, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a front-end receiving circuit and a method for the same, and more particularly to a front-end receiving circuit and method capable of reducing the voltage received by a back-end circuit by performing voltage shifting operation after a sampling circuit samples an input signal with high voltage.

BACKGROUND OF THE DISCLOSURE

In the existing Ethernet or TV front-end receiving circuit, when the RX input signal is at the high voltage level, the component that receives the input signal must be a high-voltage component, otherwise the component life may be shortened or the component may be burnt out.

In the case of a TV front-end receiving circuit, it is possible to use a low-voltage component in an amplifier back-end circuit coupled to an output terminal of an amplifier by adding a step-down amplifier. However, the amplifier must use a high-voltage component, which increased the power consumption, the use area and the noises of the circuit.

Therefore, how the above-mentioned issues can be overcome by improving the circuit design to reduce the number of high-voltage components in the front-end receiving circuit has become one of the important topics to be solved in this field.

SUMMARY OF THE DISCLOSURE

The technical problem to be solved by the present disclosure is to provide a front-end receiving circuit, which includes a first input terminal receiving a first signal, a second input terminal receiving a second signal, a comparator, a first sampling switch, a first sampling shifting circuit and a control circuit. The comparator has a first comparator input terminal and a second comparator input terminal respectively coupled to the first input terminal and the second input terminal. The first sampling switch is coupled between the first input terminal and the first comparator input terminal. The first sampling shifting circuit includes a first capacitor, a first reference voltage source and a second reference voltage source. The first capacitor has one end connected between the first sampling switch and the first comparator input terminal, the first reference voltage source is coupled to another end of the first capacitor through a second sampling switch, a second reference voltage source is coupled to the another end of the first capacitor through a first shifting switch. The control circuit is configured to be electrically and respectively coupled to the first sampling switch, the second sampling switch and a control end of the first shifting switch, to control the first sampling switch, the second sampling switch and the first shifting switch to be switched between an ON state and an OFF state. In a sampling mode, the control circuit is configured to control the first sampling switch and the second sampling switch to be turned on, and control the first shifting switch to be turned off. In a shifting mode, the control circuit is configured to control the first sampling switch and the second sampling to be turned off, and control the first shifting switch to be turned on.

The technical problem to be solved by the present disclosure is to provide a front-end receiving method for a front-end receiving circuit, adapted for transmitting a signal to a back-end circuit connected to the front-end receiving circuit, the method includes: configuring a first input terminal to receive a first signal; configuring a second input terminal to receive a second signal; configuring a first comparator input terminal and a second comparator input terminal of a comparator to be respectively coupled to the first input terminal and the second input terminal; configuring a first sampling switch to be coupled between the first input terminal and the first comparator input terminal; configuring one end of a first capacitor of a first sampling shifting circuit to be coupled between the first sampling switch and the first comparator input terminal; configuring a first reference voltage source of the first sampling shifting circuit to be coupled to another end of the first capacitor through a second sampling switch; configuring a second reference voltage source of the first sampling shifting circuit to be coupled to the another end of the first capacitor through a first shifting switch; configuring a control circuit to be electrically and respectively coupled to the first sampling switch, the second sampling switch, and a control end of the first shifting switch; configuring the control circuit to enter a sampling mode to control the first sampling switch and the second sampling switch to be turned on, and control the first shifting switch to be turned off; and configuring the control circuit to enter a shifting mode to control the first sampling switch and the second sampling switch to be turned off, and control the first shifting switch to be turned on.

One of the advantages of the present disclosure is that the front-end receiving circuit and the front-end receiving method for the same provided by the present disclosure can transform the voltage of the sampling circuit from high voltage to low voltage after the sampling circuit samples the high voltage signal, by the technical feature of "sampling mode" and "shifting mode", such that the existing Ethernet network or TV front-end receiving circuit may be provided without a step-down amplifier.

Another beneficial effect of the present disclosure is that the present disclosure provides a front-end receiving circuit and front-end receiving method for the same provided by the present disclosure can allow the comparator and the back-end circuit to use low-voltage components by adopting the technical features of "sampling mode", "shifting mode" and "operation mode" and the operating switch having high voltage resistance, so as to provide high speed, low power consumption and small area characteristics.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
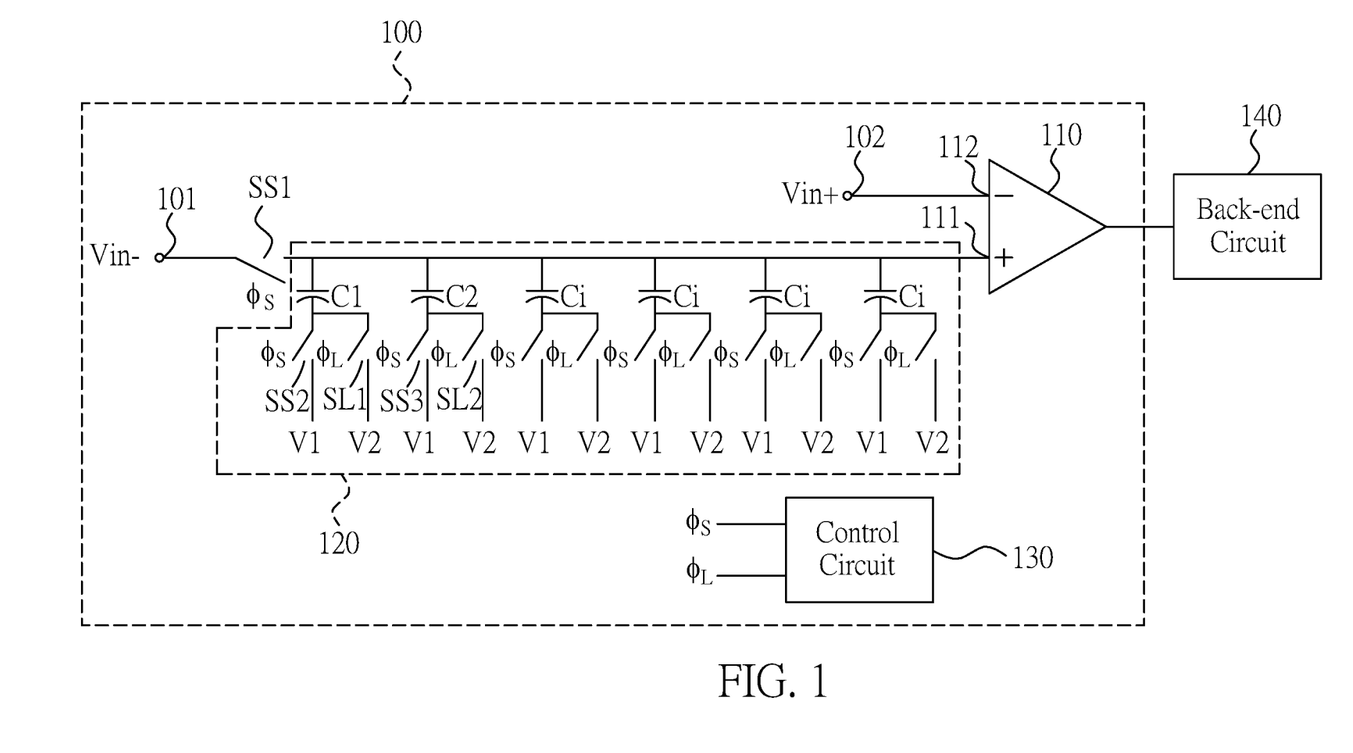
FIG. 1 is a circuit architecture diagram of a front-end receiving circuit according to a first embodiment of the present disclosure.

Reference is now made to FIG. 1, which is a circuit architecture diagram of a front-end receiving circuit according to a first embodiment of the present disclosure. As shown in FIG. 1, the first embodiment of the present disclosure provides a front-end receiving circuit 100 coupling to a back-end circuit 140, and the front-end receiving circuit 100 includes a first input terminal 101 that receives a first signal Vin−, a second input terminal 102 that receives a second signal Vin+, a comparator 110, a first sampling switch SS1, a first sampling shifting circuit 120, and a control circuit 130.

The comparator 110 has a first comparator input terminal 111 and a second comparator input terminal 112 respectively coupled to the first input terminal 101 and the second input terminal 102. The first sampling switch SS1 is coupled between the first input terminal 101 and the first comparator input terminal 111. The first sampling shifting circuit 120 includes a first capacitor C1, a first reference voltage source V1 and a second reference voltage source V2. The first capacitor C1 has one end coupled between the first sampling switch SS1 and the first comparator input terminal 111, the first reference voltage source V1 is coupled to another end of the first capacitor C1 through the second sampling switch SS2, and the second reference voltage source V2 is connected to the another end of the first capacitor C1 via the first shifting switch SL1.

For example, in an existing Ethernet or TV front-end receiving circuit, the first signal Vin− and the second signal Vin+ received by the first front-end receiving circuit 100 is usually in high voltage potential, and in order to solve an issue where the step-down amplifier will increase power consumption and area of the circuit, increase the circuit noise, and the like. After the first sampling circuit 120 samples the high voltage signal, an operation for transforming high voltage to low voltage is performed on the first sampling circuit 120, so that the existing Ethernet network or TV front-end receiving circuit can be provided without the step-down amplifier.

For this purpose, the front-end receiving circuit 100 also includes a control circuit 130, which is electrically and respectively coupled to the first sampling switch SS1, the second sampling switch SS2 and the first shift switch SL1 control end. The control circuit 130 respectively outputs a sampling signal $\phi_S$ to the first sampling switch SS1 and the second sample switch SS2, and outputs a shifting signal $\phi_L$ to the first shifting switch SL1, in order to respectively control the first sampling switch SS1, the second sampling switch SS2 and the first shifting switch SL1 to be switched between an ON state and an OFF state.

In the present embodiment, the first sampling shifting circuit 120 further includes a second capacitor C2, a third sampling switch SS3 and a second shifting switch SL2. The second capacitor C2 has one end coupled between the first sampling switch SS1 and the first comparator input terminal 111, the third sampling switch SS3 is coupled between another end of the second capacitor C2 and the first reference voltage source V1, and the second shifting switch SL2 is coupled between the another end of the second capacitor C2 and the second reference voltage source V2. Furthermore, the first sampling shifting circuit 120 further includes a capacitor Ci, an arrangement of which is similar to those of the first capacitor C1 and the second capacitor C2 that are coupled to the first reference voltage source V1 through the sampling switch and coupled to the second reference voltage source V2 through the shifting switch, and therefore repeated description is omitted.

In a sampling mode, the control circuit 130 controls the first sampling switch SS1, the second sampling switch SS2 and the third sampling switch SS3 to be turned ON, and controls the first shifting switch SL1 and the second shifting switch SL2 to be turned OFF, or alternatively, controls all of the sampling switches to be turned ON in the presence of other capacitors Ci, so as to make all capacitors sample the first signal Vin- and the first reference voltage source V1, thus allowing a common-mode voltage to be sampled.

After the sampling mode ends, a shifting mode is further entered into. In the shifting mode, the control circuit 130 controls the first sampling switch SS1 to be turned off, at least one of the second sampling switch SS2 and the third sampling switch SS3 to be turned off, and one of the first shifting switch SL1 and the second shifting switch SL2 corresponding to the turned off sampling switch to be turned off. Alternatively, in the presence of a plurality of capacitors Ci, several of the sampling switches are turned off to switch to second reference voltage source V2, and a potential of the first reference voltage source V1 is higher than that of the second reference voltage V2.

In detail, the control circuit 130 can control a lower portion of the first sampling circuit 110, including a certain number of capacitors, such as the first capacitor C1, the second capacitor C2 and the plurality of capacitors Ci coupled to the first reference voltage V1 to reconnect to the second reference voltage source V2, so as to make the sampled common-mode voltage in the high voltage range drop to another common-mode voltage in the low voltage range at the end of the sampling mode.

For example, supposing that the first capacitor C1, the second capacitor C2 and four capacitors Ci are provided with the same capacitance value C as shown in the figure, the potential of the first reference voltage source V1 is 1V, the second reference voltage source V2 is 0V, and the common-mode voltage Vcm obtained in the sampling mode is 1.6V. In the shifting mode, three of the capacitors are reconnected to the second reference voltage source V2, and the shifted common-mode voltage X can be calculated by the following equation (1):

$$X=1.6+(V2-V1)*3C/6C \qquad \text{Equation (1);}$$

By substituting the above values into the equation, the shifted common-mode voltage X can be obtained as 1.1V. Therefore, the common-mode voltage of 1.6 V in the high voltage range can be lowered to another common-mode voltage of 1.1 V in the low voltage range by alternately performing the sampling mode and the shifting mode on the circuit architecture of the present disclosure. Moreover, by controlling the amount of capacitance to be switched, the common-mode voltage value to be obtained can be controlled.

In this case, the first sampling switch SS1, the second sampling switch SS2, the first shifting switch SL1, and the input pair component (not shown) coupling to the first comparator input terminal 111 and the second comparator input terminal 112 can operate in the high voltage range, and the back-end circuit 140 can operate in the low voltage range. For example, the high voltage range can be greater than 1.5V, and the low voltage range can be less than 1.2V. It should be noted that the components exposed to the high voltage must use high-voltage resistance components, in other words, the first sampling switch SS1, the second sampling switch SS2, the first shifting switch SL1, and the input pair component coupled to the first comparator input terminal 111 and the second comparator input terminal 112 must use high-voltage components.

Figure 2:
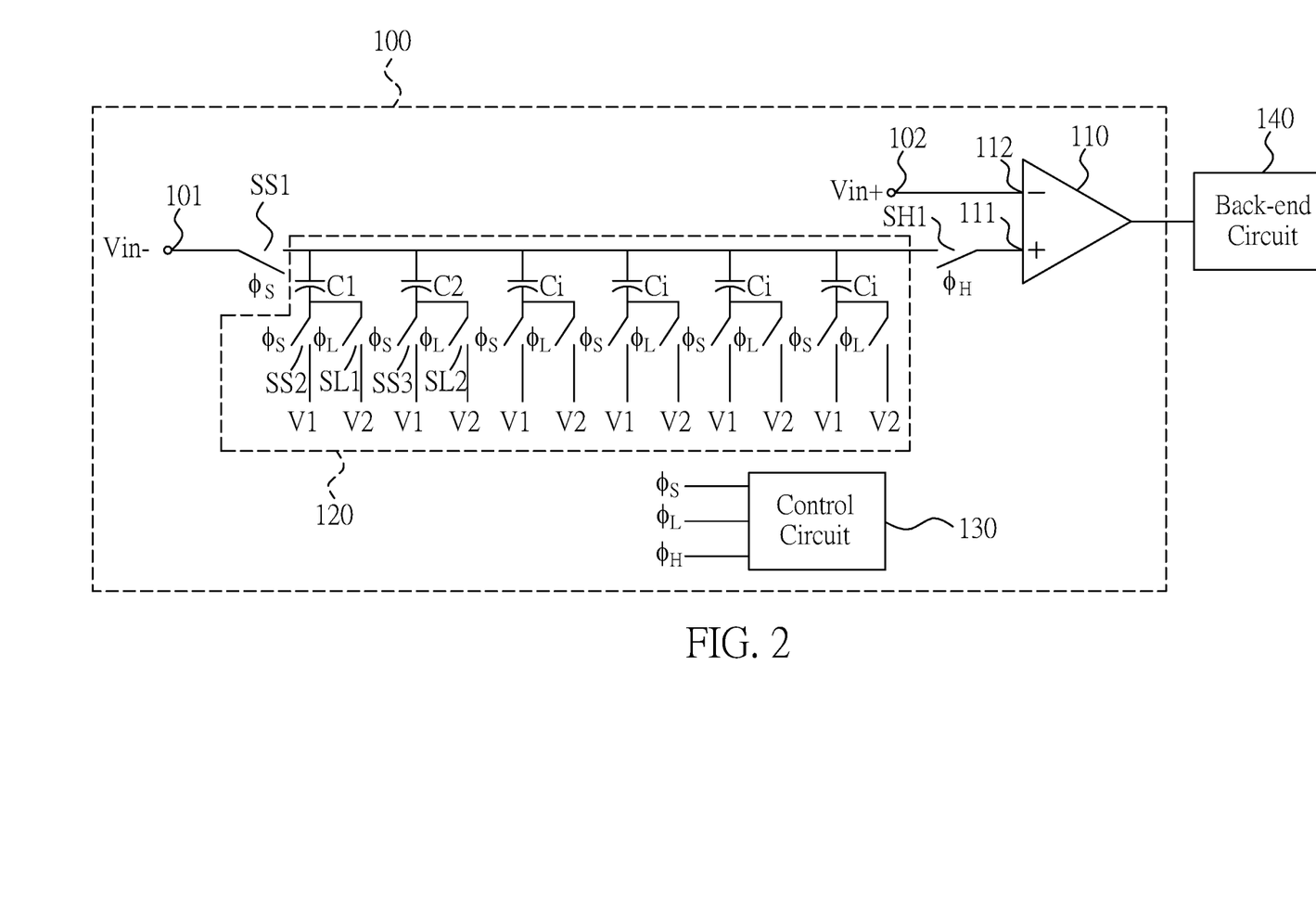
FIG. 2 is another circuit architecture diagram of the front-end receiving circuit according to the first embodiment of the present disclosure.

Furthermore, reference is now made to FIG. 2, which is another circuit architecture diagram of the front-end receiving circuit according to the first embodiment of the present disclosure. The front-end receiving circuit 100 can further include a first operating switch SH1 coupled between one end of the first capacitor C1 and the first comparator terminal input 111. The control circuit 130 can be configured to enter the shifting mode after an operation mode. In the operation mode, the control circuit 130 controls the first sampling switch SS1, the second sampling switch SS2 and the first shifting switch SL1 to be turned off, and controls the first operating switch SH1 to be turned on. Further, in the presence of the second capacitor C2 and the plurality of capacitors Ci, the control circuit 130 further controls the third switch SS3, the second shifting switch SL2 and other sampling switches and shifting switches to be turned off. It should be noted that only the first sampling switch SS1, the second sampling switch SS2, the first shifting switch SL1, the third sampling switch SS3, the second shifting switch SL2 and all other sampling switches, shifting switches, and the first operation switch SH1 will be exposed to the high voltage signal. Therefore, high voltage components are required to be utilized to operate under the high voltage range. In this case, the comparator 110 and the back-end circuit 140 can operate at low voltage range, and thus low voltage components can be used. Similarly, the high voltage range can be greater than 1.5V the low voltage range can be less than 1.2V.

Figure 3:
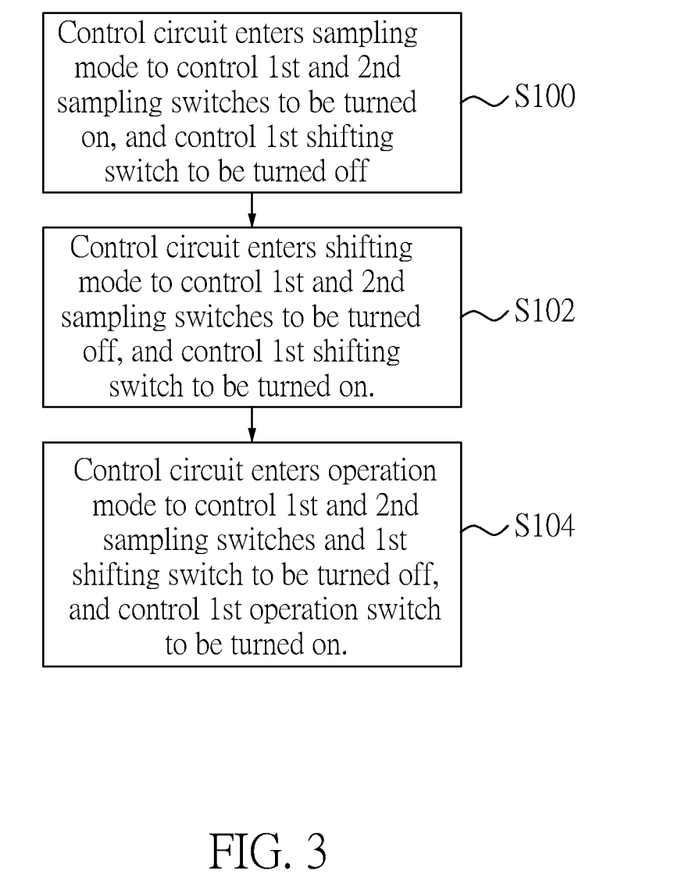
FIG. 3 is a flow chart of a front-end receiving method for a front-end receiving circuit according to the first embodiment of the present disclosure.

Reference is now made to FIG. 3, which is a flow chart of a front-end receiving method for a front-end receiving circuit according to the first embodiment of the present disclosure. Based on the above configuration, the present disclosure also provides a front-end receiving method for the front-end receiving circuit 100 to transmit signals to the back-end circuit 140 coupled to the front-end receiving circuit 100. The method described in this embodiment can be performed on the front-end receiving circuit 100 shown in FIG. 1 or FIG. 2, thus reference should be made to FIG. 1 and FIG. 2 for better understanding. The front-end receiving method for the front-end receiving circuit includes the following steps:

Step S100: configuring the control circuit to enter the sampling mode to control the first sampling switch and the second sampling switch to be turned on, and control the first shifting switch to be turned off.

Step S102: configuring the control circuit to enter the shifting mode to control the first sampling switch and the second sampling switch to be turned off, and control the first shifting switch to be turned on.

Preferably, in the case that the first operation switch SH1 is provided, the method may further proceed to step S104: configuring the control circuit to enter the operation mode to control the first sampling switch, the second sampling switch and the first shifting switch to be turned off, and control the first operation switch to be turned on.

By utilizing the above configuration, after the sampling circuit samples the high voltage signal, the shifting operation is performed on the sampling circuit to transform the voltage thereof from the high voltage to the low voltage, so that the existing Ethernet network or TV front-end receiving circuit may be provided without the step-down amplifier. Moreover, by additionally providing a high-voltage-resistant operation switch, both the comparator and the back-end circuit can use low-voltage components, so as to provide high speed, low power consumption and small area characteristics.

This embodiment only exemplifies the core concept of the present disclosure, and more details will be provided in the following embodiments in accordance with the accompanying drawings.

Second Embodiment

Figure 4:
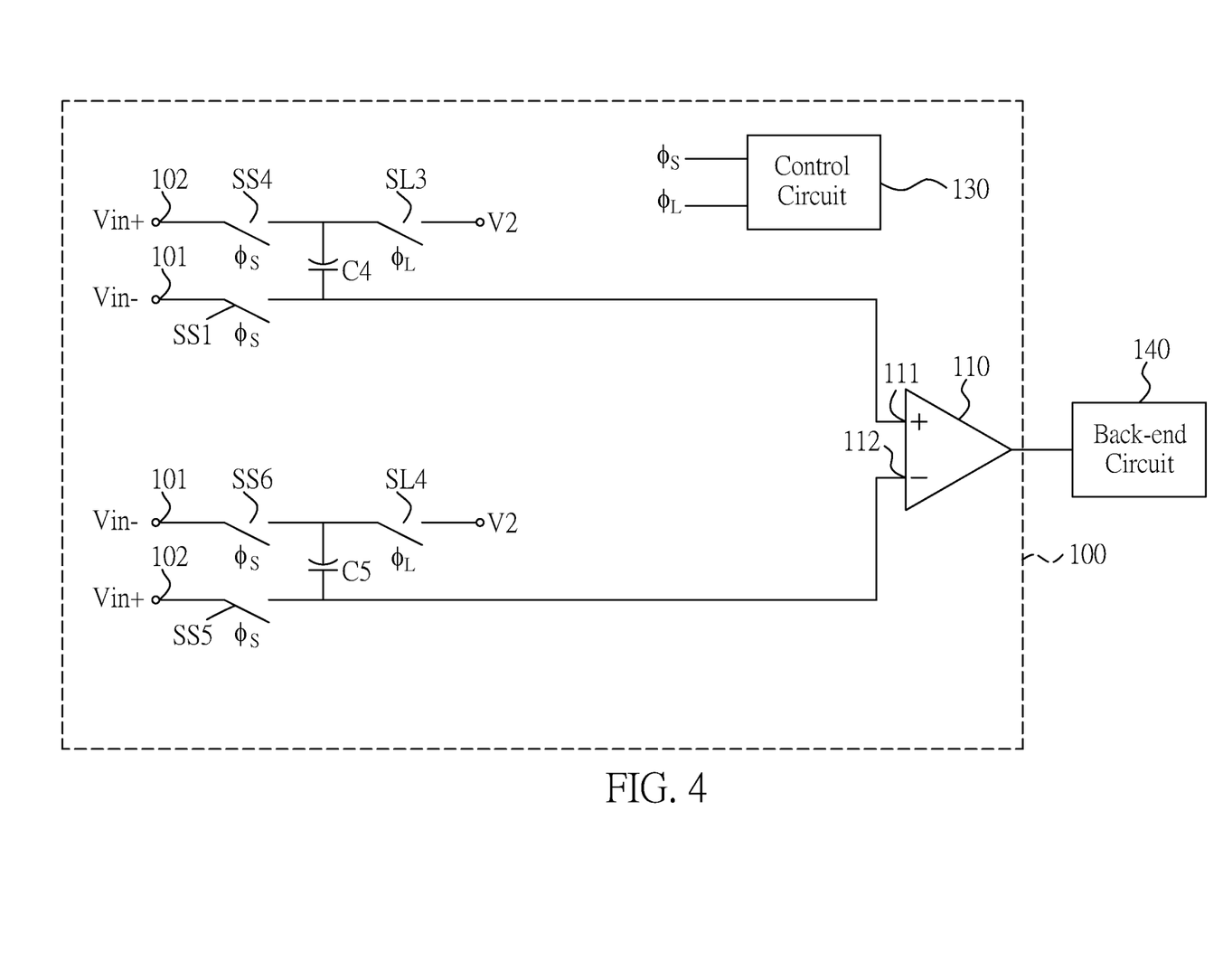
FIG. 4 is a circuit architecture diagram of a front-end receiving circuit according to a second embodiment of the present disclosure.

Reference is now made to FIG. 4, which is a circuit architecture diagram of a front-end receiving circuit according to a second embodiment of the present disclosure. As shown in FIG. 4, the second embodiment of the present disclosure provides a front-end receiving circuit 100 coupled to a back-end circuit 140. The front-end receiving circuit 100 includes a first input terminal 101 receiving a first signal Vin−, a second input terminal 102 receiving a second signal Vin+, the comparator 110, the first sampling switch SS1, the first sampling shifting circuit 120, and the control circuit 130. In the present embodiment, similar elements are denoted by similar reference numerals, and the present embodiment is described on the basis of FIG. 1, and thus repeated descriptions are omitted.

The difference between the this embodiment and the foregoing embodiment is that the front-end receiving circuit 100 further includes a fourth sampling switch SS4, a fifth sampling switch SS5, and a sixth sampling switch SS6. The fourth sampling switch SS4 has one end coupling to the second input terminal 102 and another end coupling to the first comparator input terminal 111 through a fourth capacitor C4, and the another end of the fourth sampling switch SS4 is coupled to the second reference voltage source V2 through the third shifting switch SL3. The fifth sampling switch SS5 is coupled between the second input terminal 102 and the second comparator input terminal 112. The sixth sampling switch SS6 has one end coupling to the first input terminal 101 and another end coupling to the second comparator input terminal 112 through the fifth capacitor C5, and the another end of the sixth sampling switch SS6 is coupled to the second reference voltage source V2 through the fourth shifting switch SL4.

The control circuit 130 is further electrically and respectively coupled to control terminals of the fourth sampling switch SS4, the fifth sampling switch SS5, the sixth sampling switch SS6, the third shifting switch SL3 and the fourth shifting switch SL4. The control circuit 130 respectively outputs sampling signals $\phi_S$ to the fourth sampling switch SS4, the fifth sampling switch SS5, the sixth sampling switch SS6, and outputs shifting signals $\phi_L$ to the third shifting switch SL3 and the fourth shifting switch SL4, so as to respectively control the fourth sampling switch SS4, the fifth sampling switch SS5, the sixth sampling switch SS6, the third shifting switch SL3 and the fourth shifting switch SL4 to be switched between an ON state and an OFF state.

In detail, the voltage level of the high voltage signal in the common-mode may be too high in practical implementation. Even if the shifting mode in the foregoing embodiment is used to shift the sampled common-mode high voltage signal downward, the shifted voltage level would still be too high. Therefore, the present embodiment adopts a structure as shown in FIG. 4, and the control circuit 130 is configured to respectively enter the sampling mode and the shifting mode.

In the sampling mode, the control circuit 130 is configured to control the first sampling switch SS1, the fourth sampling switch SS4, the fifth sampling switch SS5 and the sixth sampling switch SS6 to be turned on, and the first shift switch SL1, the third shifting switch SL3 and the fourth shifting switch SL4 to be turned off. The shifting mode is entered into after the sampling mode, the control circuit 130 is then configured to control the first sampling switch SS1, the fourth sampling switch SS4, the fifth sampling switch SS5 and the sixth sampling switch SS6 to be turned off, and control the first shifting switch SL1, the third shifting switch SL3 and fourth shifting switch SL4 to be turned on.

In more detail, in the sampling mode, both ends of the fourth capacitor C4 and the fifth capacitor C5 sample the differential signal, and the common-mode voltage of the first signal Vin− and the second signal Vin+ will not be sampled in this case. In the shifting mode, upper portions of the fourth capacitor C4 and the fifth capacitor C5, that is, the first comparator input terminal 111 and the second comparator input terminal 112, will be have the voltage of the second reference voltage source V2 being changed thereto during the shifting mode, rather than the high-voltage common-mode voltage during the sampling operation. When a common-mode voltage is 3.3V, and the voltage of the second reference voltage source V2 is 0.5V, the sampling phase and the shifting phase can be easily operated, such that the common-mode voltage of 3.3V in the high voltage range can be decreased to another common-mode voltage of 0.5V in the low voltage range, that is, generating a common-mode voltage shift of 2.8V.

After the shifting mode, the common-mode voltage $V_{cm\_after\_phyL}$ for the first comparator input terminal 111 can be obtained by the following equation (2):

$$V_{cm\_after\_phyL} = V_{cm\_HV} + \frac{C_4}{C_1 + C_2 + C_3 + C_4}(V_2 - V_{cm\_HV}) + \frac{C_1 + C_2 + C_3}{C_1 + C_2 + C_3 + C_4}(V_2 - V_1). \quad \text{Equation (2)}$$

The fourth capacitor C4 and the fifth capacitor C5 can be the same capacitor, thus the common-mode voltage for the second comparator input terminal 112 can be obtained accordingly. Similarly, in this case, the first sampling switch SS1, the fourth sampling switch SS4, the fifth sampling switch SS5 and the sixth sampling switch SS6 are turned on; the first shifting switch SL1, the third shifting switch SL3, the fourth shifting switch SL4, and the input pair component (not shown) coupling to the first comparator input terminal 111 and the second comparator input terminal 112 can operate in the high voltage range, and the back-end circuit 140 can operate in the low voltage range. For example, the high voltage range can be greater than 1.5V, the low voltage range can be less than 1.2V. It should be noted that the components exposed to the high voltage must use high-voltage resistance components, in other words, the first sampling switch SS1, the fourth sampling switch SS4, the fifth sampling switch SS5, the sixth sampling switch SS6, the first shifting switch SL1, the third shifting switch SL3, the fourth shifting switch SL4, and the input pair component coupled to the first comparator input terminal 111 and the second comparator input terminal 112 must use high-voltage components.

Figure 5:
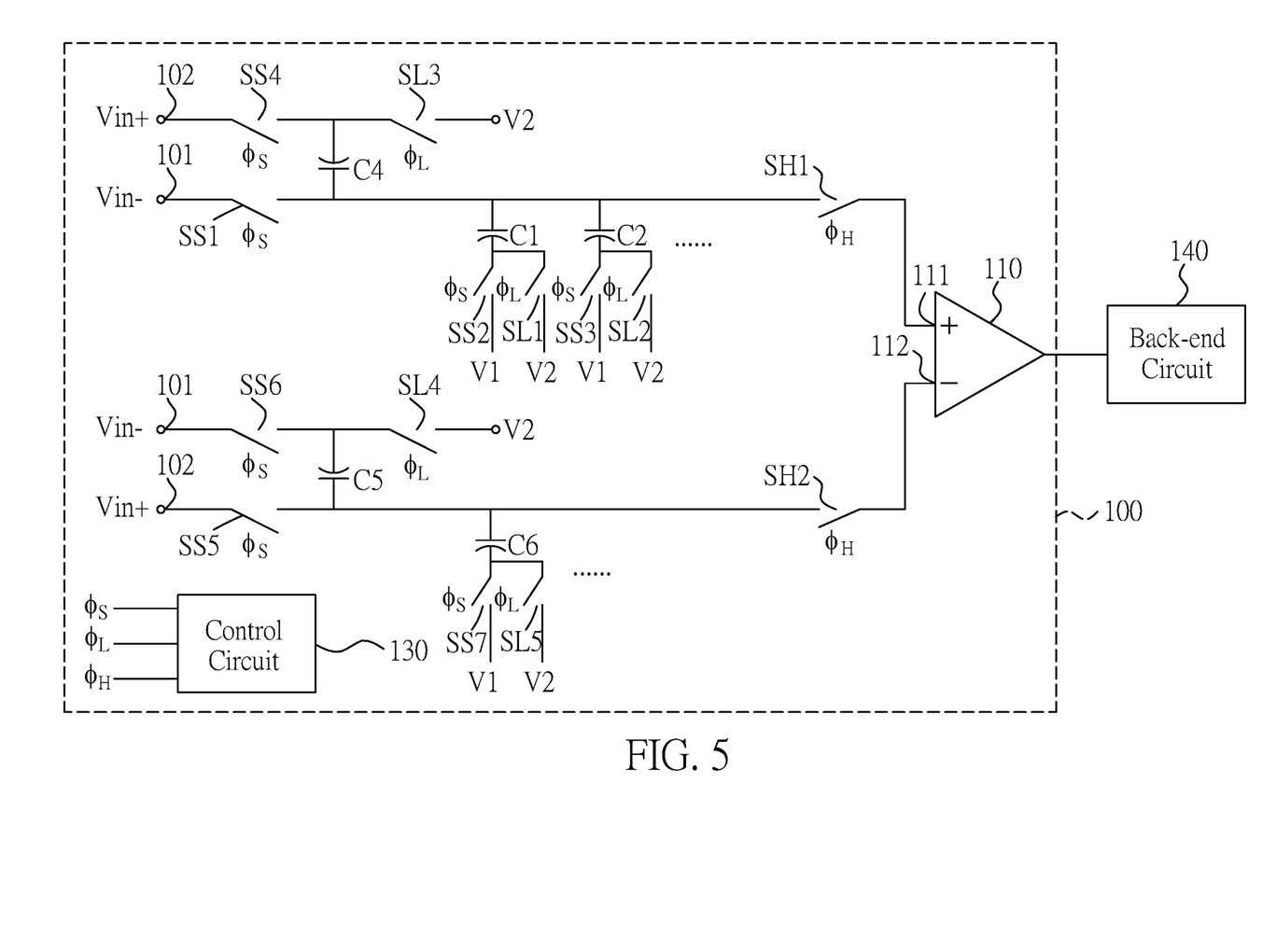
FIG. 5 is another circuit architecture diagram of the front-end receiving circuit according to the second embodiment of the present disclosure.

Furthermore, reference can be made to FIG. 5, which is another circuit architecture diagram of the front-end receiving circuit according to the second embodiment of the present disclosure. The front end receiving circuit 100 further includes a second sampling shifting circuit including a sixth capacitor C6, a seventh sampling switch SS7, and a fifth shifting switch SL5. One end of the sixth capacitor C6 is connected between the fifth sampling switch SS5 and the second comparator input terminal 112, and the seventh sampling switch SS7 is connected between the first reference voltage source V1 and another end of the sixth capacitor C6. The fifth shifting switch SL5 is coupled between the second reference voltage source V2 and another end of the sixth capacitor C6. The control circuit 130 is further configured to be electrically coupled to the seventh sampling switch SS7 and the fifth shifting switch SL5, to respectively control the seventh sampling switch SS7 and the fifth shifting switch SL5 to be switched between an ON state and an OFF state. The configuration of the second sampling shifting circuit is equivalent to that of the first sampling circuit 120, and thus repeated descriptions are omitted.

The front end receiving circuit 100 may further include a first operating switch SH1 and a second operating switch SH2. The first operating switch SH1 is coupled between one end of the first capacitor C1 and the first comparator input terminal 111, and the second operating switch SH2 is coupled between the one end of the sixth capacitor C6 and the second comparator input terminal 112. After the shifting mode ends, the control circuit 130 is further configured to enter an operation mode. In the operation mode, the control circuit 130 controls the first sampling switch SS1, the second sampling switch SS2, the third sampling switch SS3, the fourth sampling switch SS4, the fifth sampling switch SS5, the sixth sampling switch SS6, the seventh sampling switch SS7, the first shifting switch SL1, the second shifting switch SL2, the third shifting switch SL3, the fourth shifting switch SL4, and the fifth shifting switch SL5 to be turned off, and control the first operating switch SH1 to be turned on. Further, in the presence of multiple capacitors Ci, the control circuit 130 further controls all of the other sampling switches and the shifting switches to be turned off. It should be noted that in this embodiment, only the first sampling switch SS1, the second sampling switch SS2, the third sampling switch SS3, the fourth sampling switch SS4, the fifth sampling switch SS5, the sixth sampling switch SS6, the seventh sampling switch SS7, the first shifting switch SL1, the second shifting switch SL3, the third shifting switch SL3, the fourth shifting switch SL4, the fifth shifting switch SL5, and all other sampling switches, shifting switches, the first operation switch SH1 and the second operation Switch SH2 will be exposed to the high voltage signal; therefore, high voltage components are required to be used to operate under the high voltage range. In this case, the comparator 110 and the back-end circuit 140 can operate at low voltage range, and thus low voltage components can be used. Similarly, the high voltage range can be greater than 1.5V, the low voltage range can be less than 1.2V.

Figure 6:
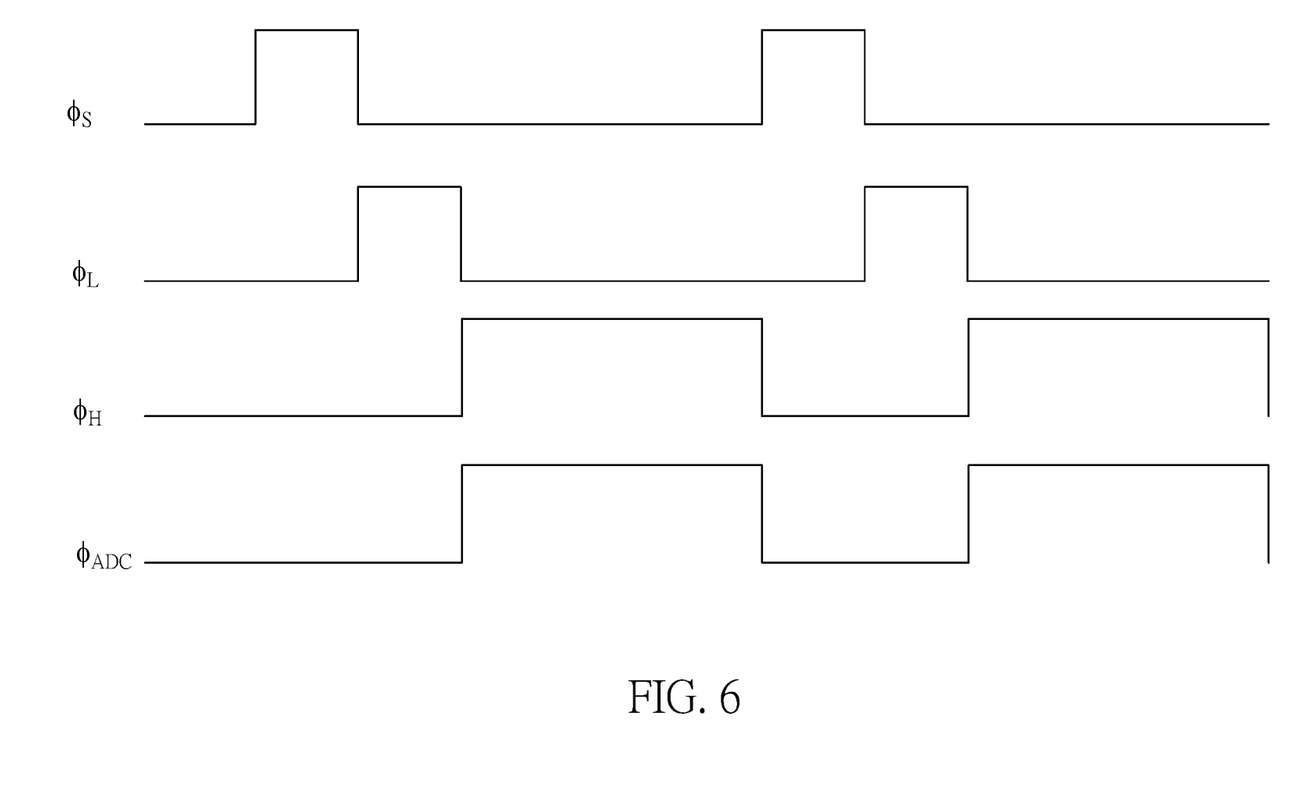
FIG. 6 is a timing diagram of a sampling signal $\phi_S$, a shifting signal $\phi_L$, an operation signal $\phi_H$, and an analog-to-digital converter signal $\phi_{ADC}$ according to the second embodiment of the present disclosure.

Further, reference is now made to FIG. 6, which is a timing diagram of a sampling signal $\phi_S$, a shifting signal $\phi_L$, an operation signal $\phi_H$, and an analog-to-digital converter signal $\phi_{ADC}$ according to the second embodiment of the present disclosure. As shown in FIG. 6, the front end receiving circuit of the present disclosure is commonly used in an Ethernet or television front end receiving circuit to receive an RX input signal and convert it into an analog-to-digital converter. For the sampling signal $\phi_S$, after the sampling circuit samples the high voltage signal, the shifting operation corresponding to the shifting signal $\phi_L$ is performed on the sampling circuit to transform the voltage from the high voltage to the low voltage thereof. Moreover, by additionally providing a high-voltage-resistant operation switch and entering the operation mode corresponding to the operation signal $\phi_H$, both the comparator and the back-end circuit can use low-voltage components, so as to provide high speed, low power consumption and small area characteristics.

Figure 7:
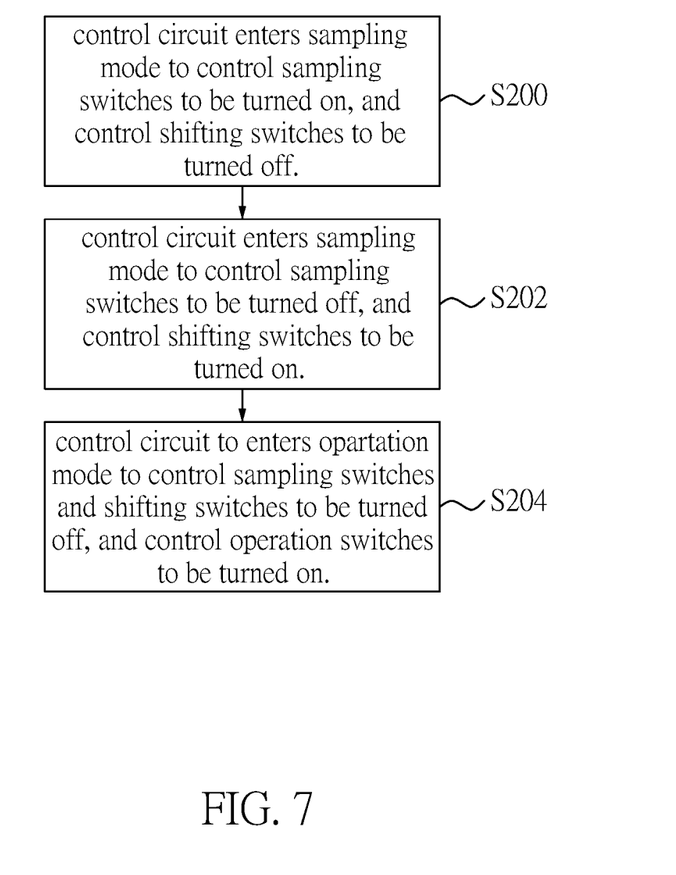
FIG. 7 is a flow chart of a front-end receiving method for a front-end receiving circuit according to the second embodiment of the present disclosure.

Reference is now made to FIG. 7, which is a flow chart of a front-end receiving method for a front-end receiving circuit according to the second embodiment of the present disclosure. Based on the above configuration, the present disclosure also provides a front-end receiving method for the front-end receiving circuit 100 to transmit signals to the back-end circuit 140 coupled to the front-end receiving circuit 100. The method described in this embodiment can be performed on the front-end receiving circuit 100 shown in FIG. 4 or FIG. 5, thus reference should be made to FIG. 4 and FIG. 5 for better understanding. The front-end receiving method for the front-end receiving circuit includes the following steps:

Step S200: Configuring the control circuit to enter the sampling mode to control the sampling switches to be turned on, and control the shifting switches to be turned off. In this case, configurations of the sampling switches and the shifting switches can be referred to in the above embodiments, and thus repeated descriptions are omitted hereinafter.

Step S202: Configuring the control circuit to enter the shifting mode to control the sampling switches to be turned off, and control the shifting switches to be turned on.

Preferably, in the case that the first operation switch SH1 and the second operation switch SH2 are provided, the method may further proceed to step S204: configuring the control circuit to enter the operation mode to control the sampling switches and shifting switches to be turned off, and control the operation switches to be turned on.

By adopting the above configuration, after the sampling circuit samples the high voltage signal, the shifting operation is performed on the sampling circuit to transform the voltage from the high voltage to the low voltage thereof, so that the existing Ethernet network or TV front-end receiving circuit may be provided without the step-down amplifier. Moreover, by additionally providing a high-voltage-resistant operation switch, both the comparator and the back-end circuit can use low-voltage components, so as to provide high speed, low power consumption and small area characteristics.

One of the advantages of the present disclosure is that the front-end receiving circuit and the front-end receiving method for the same provided by the present disclosure can transform the voltage of the sampling circuit from high voltage to low voltage after the sampling circuit samples the high voltage signal, by the technical features of "sampling mode" and "shifting mode", such that the existing Ethernet network or TV front-end receiving circuit may be provided without the step-down amplifier.

Another beneficial effect of the present disclosure is that the present disclosure provides a front-end receiving circuit and front-end receiving method for the same that can allow the comparator and the back-end circuit to use low-voltage components by utilizing the technical features of "sampling mode", "shifting mode" and "operation mode" and the operating switch having high voltage resistance, so as to provide high speed, low power consumption and small area characteristics.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A front-end receiving circuit connected to a back-end circuit, comprising:
   a first input terminal configured to receive a first signal;
   a second input terminal configured to receive a second signal;
   a comparator having a first comparator input terminal and a second comparator input terminal respectively connected to the first input terminal and the second input terminal;
   a first sampling switch connected between the first input terminal and the first comparator input terminal;
   a first sampling shifting circuit, which includes:
      a first capacitor having one end connected between the first sampling switch and the first comparator input terminal;
      a first reference voltage source connected to another end of the first capacitor through a second sampling switch; and
      a second reference voltage source connected to the another end of the first capacitor through a first shifting switch; and
   a control circuit, configured to be electrically and respectively coupled to the first sampling switch, the second sampling switch and a control end of the first shifting switch, to control the first sampling switch, the second sampling switch and the first shifting switch to be switched between an ON state and an OFF state,
   wherein in a sampling mode, the control circuit is configured to control the first sampling switch and the second sampling switch to be turned on, and control the first shifting switch to be turned off; and
   wherein in a shifting mode, the control circuit is configured to control the first sampling switch and the second sampling to be turned off, and control the first shifting switch to be turned on.

2. The front-end receiving circuit according to claim 1, wherein the first sample shifting circuit includes:
   a second capacitor having one end coupled between the first sampling switch and the first comparator input terminal;
   a third sampling switch coupled between another end of the second capacitor and the first reference voltage source; and
   a second shifting switch coupled between the another end of the second capacitor and the second reference voltage source,
   wherein in the sampling mode, the control circuit is configured to control the first sampling switch, the second sampling switch and the third sampling switch to be turned on, and control the first shifting switch and the second shifting switch to be turned off;
   wherein in a shifting mode, the control circuit is configured to control the first sampling switch to be turned off, control at least one of the second sampling switch and the third sampling switch to be turned off, and control at least one of the first shifting switch and the second shifting switch to be turned on.

3. The front-end receiving circuit according to claim 1, wherein the first sampling switch, the second sampling switch, the first shifting switch, and an input pair component coupled to the first comparator input terminal and the second comparator input terminal operate in a high voltage range, and the back-end circuit operates in a low voltage range.

4. The front-end receiving circuit according to claim 3, wherein the high voltage range is greater than 1.5V and the low voltage range is less than 1.2V.

5. The front-end receiving circuit according to claim 1, further comprising:
   a first operating switch coupled between one end of the first capacitor and the first comparator input terminal,
   wherein in an operation mode, the control circuit is configured to control the first sampling switch, the second sampling switch, and the first shifting switch to be turned off, and the first operation switch to be turned on.

6. The front-end receiving circuit according to claim 5, wherein the first sampling switch, the second sampling switch, the first shifting switch and the first operating switch operate in a high voltage range, the comparator and the back-end circuit operate in a low voltage range.

7. The front-end receiving circuit according to claim 6, wherein the high voltage range is greater than 1.5V and the low voltage range is less than 1.2V.

8. The front-end receiving circuit according to claim 1, further comprising:
   a fourth sampling switch having one end coupled to the second input terminal and another end coupled to the first comparator input terminal through a fourth capacitor, and the another end of the fourth sampling switch is coupled to the second reference voltage source through the third shifting switch;
   a fifth sampling switch coupled between the second input terminal and the second comparator input terminal; and
   a sixth sampling switch having one end coupled to the first input terminal and another end coupled to the second comparator input terminal through a fifth capacitor, wherein the another end of the sixth sampling switch is coupled to the second reference voltage source through the fourth shifting switch;
   wherein the control circuit is configured to be electrically coupled to the fourth sampling switch, the fifth sampling switch, the sixth sampling switch, the third shifting switch and a control terminal of the fourth shifting switch to respectively control the fourth sampling switch, the fifth sampling switch, the sixth sampling switch, the third shifting switch and the fourth shifting switch to be switched between an ON state and an OFF state.

9. The front-end receiving circuit according to claim 8, wherein in the sampling mode, the control circuit is configured to control the first sampling switch, the fourth sampling switch, the fifth sampling switch, and the sixth sampling switch to be turned on, and control the first shifting switch, the third shifting switch, and the fourth shifting switch to be turned off; and
   wherein in the shifting mode, the control circuit is configured to control the first sampling switch, the fourth sampling switch, the fifth sampling switch to be turned off, and control the first shifting switch, the third shifting switch, and the fourth shifting switch to be turned on.

10. The front-end receiving circuit according to claim 8, further including a second sampling shifting circuit, wherein the second sampling shifting switch includes:

a sixth capacitor having one end coupled between the fifth sampling switch and the second comparator input terminal;
a seventh sampling switch coupled between the first reference voltage source and another end of the sixth capacitor; and
a fifth shifting switch coupled between the second reference voltage source and the another end of the sixth capacitor,
wherein the control circuit is further configured to be electrically coupled to the seventh sampling switch and the fifth shifting switch to respectively control the sixth sampling switch and the fifth shifting switch to be switched between an on state and an off state.

11. The front-end receiving circuit according to claim 10, further comprising:
a first operating switch coupled between one end of the first capacitor and the first comparator input terminal; and
a second operating switch coupled between one end of the sixth capacitor and the second comparator input terminal,
wherein in an operation mode, the control circuit is further configured to control the first sampling switch, the second sampling switch, the fourth sampling switch, the fifth sampling switch, the sixth sampling switch, the seventh sampling switch, the first shifting switch, the third shifting switch, the fourth shifting switch, the fifth shifting switch to be turned off, and control the first operating switch and the second operating switch to be turned on.

12. A front-end receiving method for a front-end receiving circuit, adapted for transmitting a signal to a back-end circuit connected to the front-end receiving circuit, comprising:
configuring a first input terminal to receive a first signal;
configuring a second input terminal to receive a second signal;
configuring a first comparator input and a second comparator input of a comparator to be respectively coupled to the first input terminal and the second input terminal;
configuring a first sampling switch to be coupled between the first input terminal and the first comparator input terminal;
configuring one end of a first capacitor of a first sampling shifting circuit to be coupled between the first sampling switch and the first comparator input terminal;
configuring a first reference voltage source of the first sampling shifting circuit to be coupled to another end of the first capacitor through a second sampling switch;
configuring a second reference voltage source of the first sampling shifting circuit to be coupled to the another end of the first capacitor through a first shifting switch;
configuring a control circuit to be electrically coupled to the first sampling switch, the second sampling switch, and a control end of the first shifting switch, respectively,
configuring the control circuit to enter a sampling mode to control the first sampling switch and the second sampling switch to be turned on, and control the first shifting switch to be turned off; and
configuring the control circuit to enter a shifting mode to control the first sampling switch and the second sampling switch to be turned off, and control the first shifting switch to be turned on.

13. The front-end receiving method according to claim 12, further comprising:

configuring one end of a second capacitor of the first sampling shifting circuit to be coupled between the first sampling switch and the first comparator input terminal;
configuring a third sampling switch of the first sampling shifting circuit to be coupled between another end of the second capacitor and the first reference voltage source; and
configuring a second shifting switch of the first sampling shifting circuit to be coupled between is coupled between the another end of the second capacitor and the second reference voltage source,
wherein in the sampling mode, the control circuit is further configured to control the first sampling switch to be turned on, control at least one of the second sampling switch and the third sampling switch to be turned on, and control the first shifting switch and the second shifting switch to be turned off;
wherein in the shifting mode, the control circuit is further configured to control the first sampling switch, the second sampling switch and the third sampling switch to be turned off, and control the first shifting switch and the second shifting switch to be turned on.

14. The front-end receiving method according to claim 12, wherein the first sampling switch, the second sampling switch, the first shifting switch, and an input pair component coupled to the first comparator input terminal and the second comparator input terminal operate in a high voltage range, and the back-end circuit operates in a low voltage range.

15. The front-end receiving method according to claim 12, further comprising:
configuring a first operating switch to be coupled between one end of the first capacitor and the first comparator input terminal; and
configuring the control circuit to enter an operation mode to control the first sampling switch, the second sampling switch and the first shifting switch to be turned off, and control the first shifting switch to be turned on.

16. The front-end receiving method according to claim 15, wherein the first sampling switch, the second sampling switch, the first shifting switch and the first operating switch operate in a high voltage range, the comparator and the back-end circuit operate in a low voltage range.

17. The front-end receiving method according to claim 12, further comprising:
configuring one end of the fourth sampling switch to be coupled to the second input terminal, another end of the fourth sampling switch to be coupled to the first comparator input terminal through a fourth capacitor, and configuring the another end of the fourth sampling switch to be coupled to the second reference voltage source through a third shifting switch;
configuring a fifth sampling switch to be coupled between the second input terminal and the second comparator input terminal;
configuring one end of a sixth sampling switch to be coupled to the first input terminal, and another end of the sixth sampling switch to be coupled to the second reference voltage source through a fourth shifting switch; and
configuring the control circuit to be electrically and respectively coupled to the fourth sampling switch, the fifth sampling switch, the sixth sampling switch, the third shifting switch and a control terminal of the fourth shifting switch.

18. The front-end receiving method according to claim 17, wherein in the sampling mode, the control circuit is further configured to control the first sampling switch, the fourth sampling switch, the fifth sampling switch, and the sixth sampling switch to be turned on, and control the first shifting switch, the third shifting switch, and the fourth shifting switch to be turned off; and wherein in the shifting mode, the control circuit is further configured to control the first sampling switch, the fourth sampling switch, the fifth sampling switch to be turned off, and control the first shifting switch, the third shifting switch, and the fourth shifting switch to be turned on.

19. The front-end receiving method according to claim 17, further comprising:

configuring one end of a sixth capacitor of a second sampling shifting circuit to be coupled between the fifth sampling switch and the second comparator input terminal;

configuring a seventh sampling switch of the second sampling shifting circuit to be coupled between the first reference voltage source and another end of the sixth capacitor;

configuring a fifth shifting switch of the second sampling shifting circuit to be coupled between the second reference voltage source and the another end of the sixth capacitor; and configuring the control circuit to be electrically coupled to the seventh sampling switch and a control end of the fifth shifting switch, wherein in a sampling mode, the control circuit is further configured to control the seventh sampling switch to be turned on, and control the fifth shifting switch to be turned off, wherein in the shifting mode, the control circuit is further configured to control the first sampling switch, the fourth sampling switch, the fifth sampling switch to be turned off, and control the first shifting switch, the third shifting switch, and the fourth shifting switch to be turned on.

20. The front-end receiving method according to claim 19, further comprising:

configuring a first operating switch to be coupled between one end of the first capacitor and the first comparator input terminal; and configuring a second operating switch to be coupled between the one end of the sixth capacitor and the second comparator input terminal, wherein in an operation mode, the control circuit is further configured to control the first sampling switch, the second sampling switch, the fourth sampling switch, the fifth sampling switch, the seventh sampling switch, the first shifting switch, the third shifting switch, the fourth shifting switch, the fifth shifting switch to be turned off, and control the first operating switch and the second operating switch to be turned on.

* * * * *